US011009564B2

United States Patent
Kuo

(10) Patent No.: US 11,009,564 B2
(45) Date of Patent: May 18, 2021

(54) MAGNETIC SENSOR, FABRICATION PROCESS OF PERFORATED INTEGRATED CIRCUIT MODULE AND FABRICATION PROCESS OF THE MAGNETIC SENSOR

(71) Applicant: SHENZHEN OVA SMART SENSOR TECHNOLOGY LTD, Shenzhen (CN)

(72) Inventor: Shihchiu Kuo, Dongguan (CN)

(73) Assignee: SHENZHEN OVA SMART SENSOR TECHNOLOGY LTD, Shenzhen (CN)

( * ) Notice: Subject to any disclaimer, the term of this patent is extended or adjusted under 35 U.S.C. 154(b) by 73 days.

(21) Appl. No.: 16/406,000

(22) Filed: May 7, 2019

(65) Prior Publication Data

US 2019/0361078 A1 Nov. 28, 2019

(30) Foreign Application Priority Data

May 24, 2018 (CN) .......................... 201810510143.5

(51) Int. Cl.
*G01R 33/00* (2006.01)
*H05K 1/18* (2006.01)
*G01M 1/00* (2006.01)

(52) U.S. Cl.
CPC ..... *G01R 33/0047* (2013.01); *G01R 33/0005* (2013.01); *G01R 33/0052* (2013.01); *H05K 1/181* (2013.01); *H05K 2201/10151* (2013.01)

(58) Field of Classification Search
CPC ....... G01M 1/00; G05B 1/00; G05B 2219/00; G01R 1/00
See application file for complete search history.

(56) References Cited

U.S. PATENT DOCUMENTS

| 2004/0032251 A1* | 2/2004 | Zimmerman | G01R 33/06 324/207.13 |
| 2008/0303900 A1* | 12/2008 | Stowe | F16M 11/10 348/143 |
| 2009/0001974 A1* | 1/2009 | Sheiretov | G01L 3/105 324/209 |
| 2009/0263061 A1* | 10/2009 | Takahashi | G01P 3/443 384/446 |
| 2013/0057263 A1* | 3/2013 | Hosek | G01D 5/2266 324/207.18 |
| 2016/0282141 A1* | 9/2016 | Rajamani | G01D 5/145 |

* cited by examiner

*Primary Examiner* — Jermele M Hollington
*Assistant Examiner* — Temilade S Rhodes-Vivour

(57) ABSTRACT

The present application discloses a magnetic sensor, fabrication process of perforated integrated circuit module and the magnetic sensor; the magnetic sensor comprises: a head cover, a shaft sleeve, a hollow rotating shaft, a ring alnico, a magnetic sensitive chip matrix, a printed circuit board, a device for output signal and a bottom case; all of them have a through hole except said device for output signal, said magnetic sensitive chip matrix is soldered on said printed circuit board, said device for output signal connects to said printed circuit board electrically, said printed circuit board is mounted below said hollow rotating shaft, and said head cover is mounted on said bottom case to form a cavity, said device for output signal passes out of said cavity. This magnetic sensor can be penetrated by an external shaft and has a thin thickness.

11 Claims, 2 Drawing Sheets

MAGNETIC SENSOR, FABRICATION PROCESS OF PERFORATED INTEGRATED CIRCUIT MODULE AND FABRICATION PROCESS OF THE MAGNETIC SENSOR

CROSS-REFERENCE TO RELATED APPLICATIONS

This application is based upon and claims the benefit of priority to Chinese Patent Application No. 2018105101415 filed with the Chinese Patent Office on 24 May 2018.

TECHNICAL FIELD

The present application relates to the field of sensor, in particular, it relates to magnetic sensor, servo system, perforated integrated circuit module, and fabrication process of the magnetic sensor.

BACKGROUND

Nowadays, intelligent robots are a very popular research field. Robot joints are the basic components of robots. The quality of robot joints directly affects the performance of robots. At present, most of the robot joints use closed-loop brakes for motion control. Almost all the closed-loop brakes use magnetic sensors as signal feedback electronic components, which provide extremely high-precision output signals in a full 360-degree rotation range.

The magnetic sensor usually works together with an output shaft of motor or an output shaft of speed reduction mechanism to generate an angle or position feedback signal. The output shaft of the motor or the output shaft of the speed reduction mechanism must be stably connected with the magnetic sensor in order to rotate the ring magnet synchronously with the output shaft, and then the magnetic sensor can correctly sense the rotation angle of the output shaft.

However, the existing magnetic sensor generally employs a magnetic sensing integrated circuit (IC), which is a technique of packaging an integrated circuit with an insulating plastic or ceramic material. The shell of the integrated circuit (IC) is covered with epoxy resin, and the inside of the integrated circuit (IC) has many complicated lead frame and wiring. The IC cannot be penetrated, it will damage the internal circuit if making a hole in the IC, and it also must reserves a certain space for the output shaft of the motor or the output shaft of the speed reduction mechanism to insert, which results in the overall thickness of the magnetic sensor designed by such an IC is too large, and the magnetic sensor must be placed at the extreme end of the output shaft, which is not conducive to the design of the servo system (rudder) and the design of the robot joint.

SUMMARY

In order to overcome the deficiencies of the prior art, the present application provides a magnetic sensor that can be penetrated by an external shaft and has a thin thickness.

The present application provides a fabrication process of perforated integrated circuit module, the perforated integrated circuit module making by this fabrication process can apply in the magnetic sensor to make the magnetic sensor can be penetrated by the external shaft.

The present application provides a fabrication process of said magnetic sensor, said magnetic sensor making by this fabrication process can be penetrated by an external shaft and has a thin thickness.

said magnetic sensor is achieved by the following technical solutions:

A magnetic sensor, comprises: a head cover, a shaft sleeve, a hollow rotating shaft, a ring alnico, a magnetic sensitive chip matrix, a printed circuit board, a device for output signal and a bottom case;

said head cover, said shaft sleeve, said hollow rotating shaft, said ring alnico, said printed circuit board and said bottom case all have a through hole, and said hollow rotating shaft is installed in said through hole of said shaft sleeve and extending into said through hole of said head cover, a bottom of said hollow rotating shaft has an installation position of said ring alnico, said installation position of said ring alnico surrounds said through hole of said hollow rotating shaft, said ring alnico is mounted on said installation position of said ring alnico, said magnetic sensitive chip matrix is soldered on said printed circuit board and located on a circumference which takes said through hole of said printed circuit board as a center of said circumference, said device for output signal connects to said printed circuit board electrically, said printed circuit board is mounted below said hollow rotating shaft, and said head cover is mounted on said bottom case to form a cavity for enwrapping said shaft sleeve, said hollow rotating shaft, said ring alnico, said magnetic sensitive chip matrix and said printed circuit board, and an external rotating shaft can pass though all said through holes in order to pass through said cavity and then can drive said hollow rotating shaft to rotate, said device for output signal passes out of said cavity.

Further, the center of said through holes of said head cover, said shaft sleeve, said hollow rotating shaft, said ring alnico, said printed circuit board and said bottom case are located an the same axis.

Further, the length of said circumference's diameter is 0.4 to 1.6 times of the diameter of said ring alnico.

Further, said magnetic sensitive chip matrix comprises two magnetic sensitive chips, and said two magnetic sensitive chips are distributed on said circumference at intervals of 90 degrees.

Further, said magnetic sensitive chip matrix comprises $2^n$ magnetic sensitive chips, and each of said magnetic sensitive chips is distributed on said circumference at equal angular intervals, wherein n is an integer greater than or equal to 2.

Further, said through hole of said hollow rotating shaft is D-shaped.

Said fabrication process of perforated integrated circuit module is achieved by the following technical solutions:

A fabrication process of perforated integrated circuit module, said perforated integrated circuit module comprising a magnetic sensitive chip matrix and a printed circuit board, comprising, the following steps:

making a through hole on said printed circuit board;

soldering said magnetic sensitive chips matrix on said printed circuit board and making said magnetic sensitive chips matrix locating on a circumference which takes said through hole of said printed circuit board as a center of said circumference.

Further, making said magnetic sensitive chip matrix by two magnetic sensitive chips, and setting said two magnetic sensitive chips on said circumference at intervals of 90 degrees.

Further, making said magnetic sensitive chip matrix by $2^n$ magnetic sensitive chips, and setting each of said magnetic sensitive chips on said circumference at equal angular intervals, wherein n is an integer greater than or equal to 2.

Said fabrication process of said magnetic sensor is achieved by the following technical solutions:

A fabrication process of said magnetic sensor, includes the following steps:

making components: manufacturing a head cover, a shaft sleeve, a hollow rotating shaft and a ring alnico, making a through hole on said head cover, said shaft sleeve, said hollow rotating shaft, said ring alnico, said printed circuit board and said bottom case respectively, making an installation position of said ring alnico on a bottom of said hollow rotating shaft, which surrounding said through hole of said hollow rotating shaft; manufacturing a perforated integrated circuit module by using said fabrication process of perforated integrated circuit module, and setting a device for output signal on said perforated integrated circuit module; manufacturing a bottom case which has a through hole;

assembling components: placing said perforated integrated circuit module in said bottom case, making said device for output signal passes out of said bottom case, and mounting said ring alnico on said installation position of said ring alnico, placing said hollow rotating shaft on said perforated integrated circuit module, and then mounting said shaft sleeve on said hollow rotating shaft, and mounting said head cover on said bottom case to form a cavity for enwrapping said shaft sleeve, said hollow rotating shaft, said ring alnico, said magnetic sensitive chip matrix and said printed circuit board, and making said hollow rotating shaft extending into said through hole of said head cover, making said through holes of said head cover, said shaft sleeve, said hollow rotating shaft, said ring alnico, said printed circuit board and said bottom case arrange vertically in order to make an external rotating shaft can through said cavity.

Further, when assembling components, making the center of said through holes of said head cover, said shaft sleeve, said hollow rotating shaft, said ring alnico, said printed circuit board and said bottom case locating on the same axis.

Further, making said circumference's diameter meet the requirement that its length is 0.4 to 1.6 times of the diameter of said ring alnico.

Further, making said through hole of said hollow rotating shaft be D-shaped.

Compared with the prior art, the beneficial effects of the present application are:

The magnetic sensor adopts a method of soldering a magnetic sensitive chip matrix on a printed circuit board, and making a through hole on said head cover, said shaft sleeve, said hollow rotating shaft, said ring alnico, said printed circuit board and said bottom case respectively, so that a output shaft of motor or a output shaft of the speed reduction mechanism can run through the entire magnetic sensor, so that a technician may set the magnetic sensor on any position of the output shaft of motor or speed reduction mechanism according to the structural design needs, which may greatly reduce the volume of servo system or robot joint and then the design of servo system or robot joint are more flexibly. Moreover, the thickness of the magnetic sensor is thin and the space occupied is small.

In the figure: 1, head cover; 2, shaft sleeve; 3, hollow rotating shaft; 4, ring alnico; 5, magnetic sensitive chip matrix; 6, printed circuit board; 7, device for output signal; 8, bottom case.

DESCRIPTION OF EMBODIMENTS

Embodiments of the present application are described in further detail.

The present application may be further illustrated in the following example embodiment, but examples are not limiting the scope of the present application.

Figure 1:
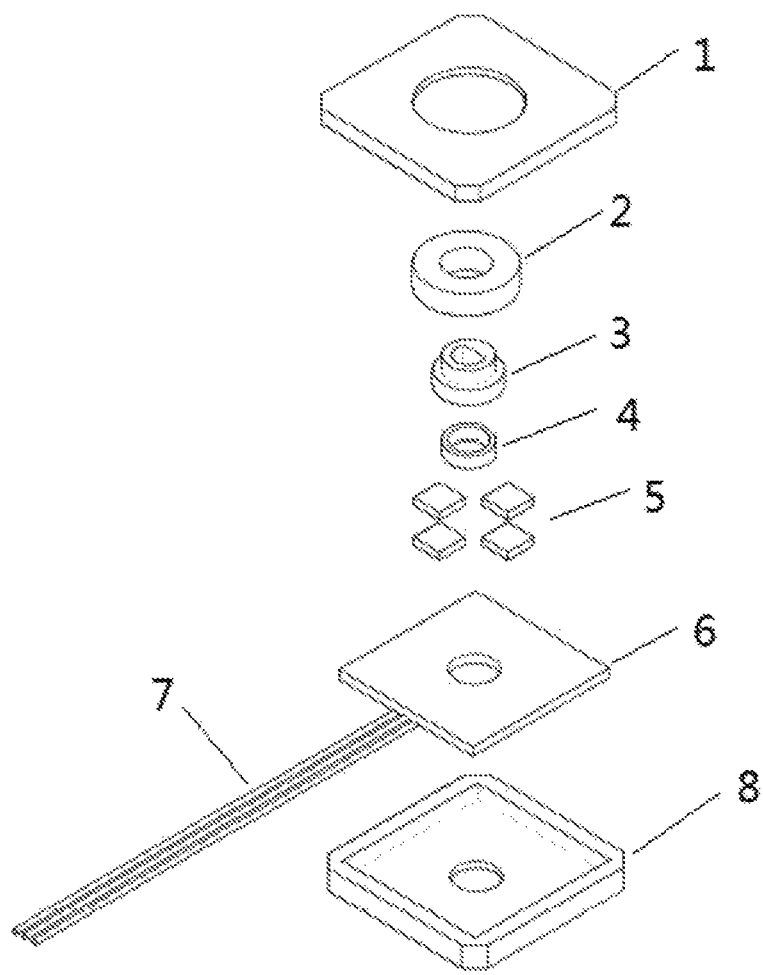
FIG. 1 is a structural exploded view of a magnetic sensor provided by the present application.
Figure 2:
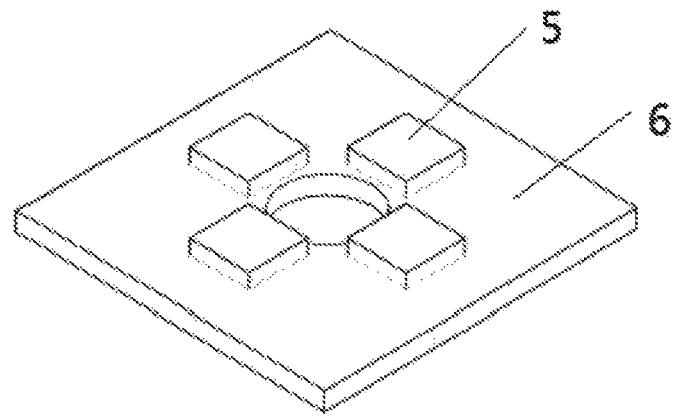
FIG. 2 is a structural diagram of a printed circuit board with a magnetic sensitive chip matrix soldered provided by the present application.
Figure 3:
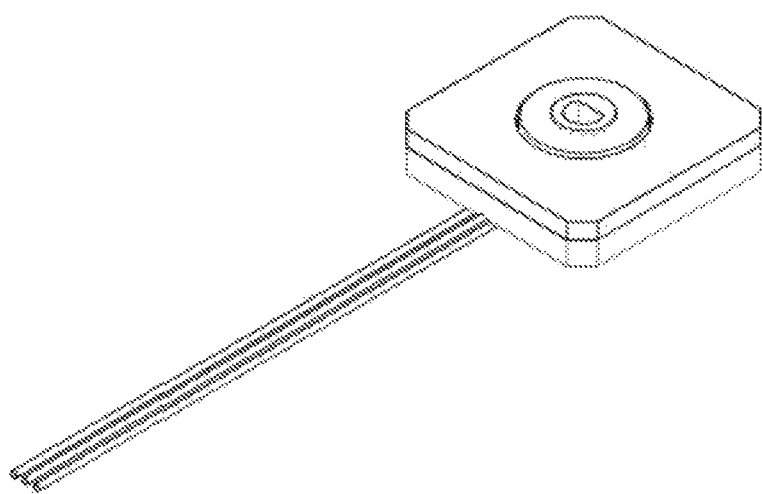
FIG. 3 is a stereogram of a magnetic sensor provided by the present application, which is an assembled magnetic sensor.

FIGS. 1 to 3, A magnetic sensor comprises: a head cover 1, a shaft sleeve 2, a hollow rotating shaft 3, a ring alnico 4, a magnetic sensitive chip matrix 5, a printed circuit, board 6, a device for output signal 7 and a bottom case 8;

said head cover 1, said shaft sleeve 2, said hollow rotating shaft 3, said ring alnico 4, said printed circuit board 6 and said bottom case 8 all have a through hole, and said hollow rotating shaft 3 is installed in said through hole of said shaft sleeve 2 and extending into said through hole of said head cover 1, a bottom of said hollow rotating shaft 3 has an installation position of said ring alnico 4, said installation position of said ring alnico 4 surrounds said through hole of said hollow rotating shaft 3, said ring alnico 4 is mounted on said installation position of said ring alnico 4, said magnetic sensitive chip matrix 5 is soldered on said printed circuit board 6 and located on a circumference which take said through hole of said printed circuit board 6 as a center of said circumference, said device for output signal 7 connects to said printed circuit board 6 electrically, said printed circuit board 6 is mounted below said hollow rotating shaft 3, and said head cover 1 is mounted on said bottom case 8 to form a cavity for enwrapping said shaft sleeve 2, said hollow rotating shaft 3, said ring alnico 4, said magnetic sensitive chip matrix 5 and said printed circuit board 6, and an external rotating shaft can pass through all said through holes in order to pass through said cavity and then can drive said hollow rotating shaft 3 to rotate, said device for output signal 7 passes out of said cavity.

The working process of the magnetic sensor as:

The output shaft of motor or speed reduction mechanism inserts into said magnetic sensor from said through hole and penetrates said magnetic sensor. When the output shaft of motor or speed reduction mechanism rotates, driving said hollow rotating shaft 3 to rotate, and then make said ring alnico 4 which embedded in said hollow rotating shaft 3 to rotate, magnetic field strength will change when said ring alnico 4 rotates, and the magnetic force acts on said magnetic sensitive chip matrix 5, so that said magnetic sensitive chip matrix 5 generates real-time analog electrical signals, after being processed by the respective circuit modules in said printed circuit board 6, the real-time analog electrical signals is taken out by said device for output signal 7.

The processing process of the analog electrical signal in said printed circuit board 6 is as follows: the analog electrical signal is subjected to front end amplification and filtering processing, and then using coordinate rotation digital calculation method to process the analog electrical signal, and then processed by the filtering module, analog signal generation module, digital signal generation module, I2C and SPI output. After all the processes, the signal output by said device for output signal 7. The output signal's high resolution linear analog or digital pulse can reach to 12-bit. The magnetic sensor can be used as an angle sensor or encoder.

It should be noted that, in the present embodiment, the shape of said hollow rotating shaft 3 is divided into upper and lower portions, the diameter of the upper portions is smaller than the diameter of the lower portions, and the upper portions of said hollow rotating shaft 3 can pass through said through hole of said shaft sleeve 2, and extend into said through hole of said head cover 1, however, the lower portions of said hollow rotating shaft 3 cannot pass through said shaft sleeve 2, said installation position of said ring alnico 4 is in the lower portions, said ring alnico 4 is installed on said installation position. Said ring alnico 4 is radial-magnetized.

As a preferred embodiment, the center of said through holes of said head cover 1, said shaft sleeve 2, said hollow rotating shaft 3, said ring alnico 4, said printed circuit board 6 and said bottom case 8 are located on the same axis.

As a preferred embodiment, the length of said circumference's diameter is 0.4 to 1.6 times of the diameter of said ring alnico 4. The diameter of said circumference formed by said magnetic sensitive chip matrix 5 soldered on said printed circuit board 6 must refer to the diameter of said ring alnico 4. In principle, the diameter of said circumference is between 0.4 and 1.6 times of the diameter of said ring alnico 4. When larger than or less than this range will affect the electrical output signal, thus affect the accuracy of the magnetic sensor.

As a preferred embodiment, said magnetic sensitive chip matrix 5 comprises two magnetic sensitive chips, and said two magnetic sensitive chips are distributed on said circumference at intervals of 90 degrees.

As a preferred embodiment, said magnetic sensitive chip matrix 5 comprises $2^n$ magnetic sensitive chips, and each of said magnetic sensitive chips is distributed on said circumference at equal angular intervals, wherein n is an integer greater than or equal to 2. Said circumference should pass through the center of each said magnetic sensitive chips within an allowable distance errors of 20%.

As a preferred embodiment, said through hole of said hollow rotating shaft 3 is D-shaped. The purpose of making said through hole of said hollow rotating shaft 3 to be D-shaped is to make the output shaft of motor or reduction mechanism can insert into said through hole and then can drive said hollow rotating shaft 3 to rotate without slippage. Of course, in addition to be D-shaped, can also be set to any other shape, only need to let the output shaft of motor or reduction mechanism can insert into said through hole and then can drive said hollow rotating shaft 3 to rotate without slippage.

The present application also provides a servo system, which comprises: a control circuit, a motor and said magnetic sensor, said magnetic sensor is mounted on an output shaft of said motor, said control circuit respectively connects with said motor, said device for output signal of said magnetic sensor electrically.

In addition, the present application also provides a fabrication process of perforated integrated circuit module, said perforated integrated circuit module comprising a magnetic sensitive chip matrix and a printed circuit board, comprising the following steps:

making a through hole on said printed circuit board;

soldering said magnetic sensitive chips matrix on said printed circuit board and making said magnetic sensitive chips matrix locating on a circumference which takes said through hole of said printed circuit board as a center of said circumference.

The present application uses a novel fabrication process of magnetic sensor THIC (Through Hole IC Technology), making a perforated integrated circuit module which is a printed circuit board soldered with magnetic sensitive chips. THIC is to solder magnetic sensitive chips with standard package on a printed circuit board by a way of matrix distribution, the printed circuit board has a through hole, and magnetic sensitive chips are soldered on a circumference which takes said through hole of said printed circuit board as a center of said circumference. Unlike the integrated circuit (IC) of conventional magnetic sensor, the perforated integrated circuit module can be penetrated by the output shaft of motor, so that using this perforated integrated circuit module may greatly reduce the volume of servo system or robot joint and then the design of servo system or robot joint are more flexibly.

As a preferred embodiment, making said magnetic sensitive chip matrix by two magnetic sensitive chips, and setting said two magnetic sensitive chips on said circumference at intervals of 90 degrees.

As a preferred embodiment, making said magnetic sensitive chip matrix by $2^n$ magnetic sensitive chips, and setting each of said magnetic sensitive chips on said circumference at equal angular intervals, wherein n is an integer greater than or equal to 2.

It should be noted, said circumference should pass through the center of each said magnetic sensitive chips within an allowable distance errors of 20%.

the present application also provides a fabrication process of a magnetic sensor, comprising the steps of:

making components: manufacturing a head cover, a shaft sleeve, a hollow rotating shaft and a ring alnico, making a through hole on said head cover, said shaft sleeve, said hollow rotating shaft, said ring alnico, said printed circuit board and said bottom case respectively, making an installation position of said ring alnico on a bottom of said hollow rotating shaft, which surrounding said through hole of said hollow rotating shaft; manufacturing a perforated integrated circuit module by using said fabrication process of perforated integrated circuit module, and setting a device for output signal on said perforated integrated circuit module; manufacturing a bottom case which has a through hole;

assembling components: placing said perforated integrated circuit module in said bottom case, making said device for output signal passes out of said bottom case, and mounting said ring alnico on said installation position of said ring alnico, placing said hollow rotating shaft on said perforated integrated circuit module, and then mounting said shaft sleeve on said hollow rotating shaft, and mounting said head cover on said bottom case to form a cavity for enwrapping said shaft sleeve, said hollow rotating shaft, said ring alnico, said magnetic sensitive chip matrix and said printed circuit board, and making said hollow rotating shaft extending into said through hole of said head cover, making said through holes of said head cover, said shaft sleeve, said hollow rotating shaft, said ring alnico, said printed circuit board and said bottom case arrange vertically in order to make an external rotating shaft can through said cavity.

According to the fabrication process of a magnetic sensor, the magnetic sensor can be penetrated by a output shaft of motor or a output shaft of the speed reduction mechanism, so that the magnetic sensor can be set on any position of the output shaft of motor or speed reduction mechanism according to the structural design needs, which may greatly reduce the volume of servo system or robot joint and then the design of servo system or robot joint are more flexibly.

As a preferred embodiment, when assembling components, making the center of said through holes of said head cover, said shaft sleeve, said hollow rotating shaft, said ring alnico, said printed circuit board and said bottom case locating on the same axis.

As a preferred embodiment, making said circumference's diameter meet the requirement that its length is 0.4 to 1.6 times of the diameter of said ring alnico. The diameter of said circumference formed by said magnetic sensitive chip matrix 5 soldered on said printed circuit board 6 must refer to the diameter of said ring alnico 4. In principle, the diameter of said circumference is between 0.4 and 1.6 times of the diameter of said ring alnico 4. When larger than or less than this range will affect the electrical output signal, thus affect the accuracy of the magnetic sensor.

As a preferred embodiment, making said through hole of said hollow rotating shaft be D-shaped. The purpose of making said through hole of said hollow rotating shaft 3 to be D-shaped is to make the output shaft of motor or reduction mechanism can insert into said through hole and then can drive said hollow rotating shaft 3 to rotate without slippage. Of course, in addition to be D-shaped, can also be set to any other shape, only need to let the output shaft of motor or reduction mechanism can insert into said through hole and then can drive said hollow rotating shaft 3 to rotate without slippage.

The embodiment of the present application described above is just a preferred embodiment, it is not just limited to the above embodiment, any other change, like modifications, substitutions, combinations, simplification, made in the present application does not depart from the spirit and principles, shall be equivalent replacement and included within the scope of the present application.

The invention claimed is:

1. A magnetic sensor, comprising a head cover, a shaft sleeve, a hollow rotating shaft, a ring alnico, a magnetic sensitive chip matrix, a printed circuit board, a device for output signal and a bottom case;

said head cover, said shaft sleeve, said hollow rotating shaft, said ring alnico, said printed circuit board and said bottom case all have a through hole, and said hollow rotating shaft is installed in said through hole of said shaft sleeve and extending into said through hole of said head cover, a bottom of said hollow rotating shaft has an installation position of said ring alnico, said installation position of said ring alnico surrounds said through hole of said hollow rotating shaft, said ring alnico is mounted on said installation position of said ring alnico, said magnetic sensitive chip matrix is soldered on said printed circuit board and located on a circumference which takes said through hole of said printed circuit board as a center of said circumference, said device for output signal connects to said printed circuit board electrically, said printed circuit board is mounted below said hollow rotating shaft, and said head cover is mounted on said bottom case to form a cavity for enwrapping said shaft sleeve, said hollow rotating shaft, said ring alnico, said magnetic sensitive chip matrix and said printed circuit board, and an external rotating shaft can pass through all said through holes in order to pass through said cavity and then can drive said hollow rotating shaft to rotate, said device for output signal passes out of said cavity;

wherein the center of said through holes of said head cover, said shaft sleeve, said hollow rotating shaft, said ring alnico, said printed circuit board, and said bottom case are located on a same axis.

2. The magnetic sensor as mentioned in claim 1, the length of said circumference's diameter is 0.4 to 1.6 times of the diameter of said ring alnico.

3. The magnetic sensor as mentioned in claim 2, said magnetic sensitive chip matrix comprises two magnetic sensitive chips, and said two magnetic sensitive chips are distributed on said circumference at intervals of 90 degrees.

4. The magnetic sensor as mentioned in claim 2, said magnetic sensitive chip matrix comprises $2^n$ magnetic sensitive chips, and each of said magnetic sensitive chips is distributed on said circumference at equal angular intervals, wherein n is an integer greater than or equal to 2.

5. The magnetic sensor as mentioned in claim 1, wherein said through hole of said hollow rotating shaft is D-shaped.

6. A fabrication process of perforated integrated circuit module, said perforated integrated circuit module comprising a magnetic sensitive chip matrix and a printed circuit board, comprising the following steps:

making a through hole on said printed circuit board;

soldering said magnetic sensitive chips matrix on said printed circuit board and making said magnetic sensitive chips matrix locating on a circumference which takes said through hole of said printed circuit board as a center of said circumference;

making said magnetic sensitive chip matrix by $2^n$ magnetic sensitive chips, and setting each of said magnetic sensitive chips on said circumference at equal angular intervals, wherein n is an integer greater than or equal to 2.

7. A fabrication process of said magnetic sensor, comprising following steps:

making components: manufacturing a head cover, a shaft sleeve, a hollow rotating shaft and a ring alnico, making a through hole on said head cover, said shaft sleeve, said hollow rotating shaft, said ring alnico, said printed circuit board and said bottom case respectively, making an installation position of said ring alnico on a bottom of said hollow rotating shaft, which surrounding said through hole of said hollow rotating shaft;

manufacturing a perforated integrated circuit module by using said fabrication process of perforated integrated circuit module, and setting a device for output signal on said perforated integrated circuit module;

manufacturing a bottom case which has a through hole;

assembling components: placing said perforated integrated circuit module in said bottom case, making said device for output signal passes out of said bottom case, and mounting said ring alnico on said installation position of said ring alnico, placing said hollow rotating shaft on said perforated integrated circuit module, and then mounting said shaft sleeve on said hollow rotating shaft, and mounting said head cover on said bottom case to form a cavity for enwrapping said shaft sleeve, said hollow rotating shaft, said ring alnico, said magnetic sensitive chip matrix and said printed circuit board, and making said hollow rotating shaft extending into said through hole of said head cover, making said through holes of said head cover, said shaft sleeve, said hollow rotating shaft, said ring alnico, said printed circuit board and said bottom case arrange vertically in order to make an external rotating shaft can through said cavity.

8. The fabrication process of said magnetic sensor as mentioned in claim 7, when assembling components, making the center of said through holes of said head cover, said shaft sleeve, said hollow rotating shaft, said ring alnico, said printed circuit board and said bottom case locating on the same axis.

9. The fabrication process of said magnetic sensor as mentioned in claim 8, making said circumference's diameter meet the requirement that its length is 0.4 to 1.6 times of the diameter of said ring alnico.

10. The fabrication process of said magnetic sensor as mentioned in claim 7, making said through hole of said hollow rotating shaft be D-shaped.

11. A magnetic sensor, comprising a head cover, a shaft sleeve, a hollow rotating shaft, a ring alnico, a magnetic sensitive chip matrix, a printed circuit board, a device for output signal and a bottom case;

said head cover, said shaft sleeve, said hollow rotating shaft, said ring alnico, said printed circuit board and said bottom case all have a through hole, and said hollow rotating shaft is installed in said through hole of said shaft sleeve and extending into said through hole of said head cover, a bottom of said hollow rotating shaft has an installation position of said ring alnico, said installation position of said ring alnico surrounds said through hole of said hollow rotating shaft, said ring alnico is mounted on said installation position of said ring alnico, said magnetic sensitive chip matrix is soldered on said printed circuit board and located on a circumference which takes said through hole of said printed circuit board as a center of said circumference, said device for output signal connects to said printed circuit board electrically, said printed circuit board is mounted below said hollow rotating shaft, and said head cover is mounted on said bottom case to form a cavity for enwrapping said shaft sleeve, said hollow rotating shaft, said ring alnico, said magnetic sensitive chip matrix and said printed circuit board, and an external rotating shaft can pass through all said through holes in order to pass through said cavity and then can drive said hollow rotating shaft to rotate, said device for output signal passes out of said cavity;

wherein said through hole of said hollow rotating shaft is D-shaped.

* * * * *